US007259065B2

(12) United States Patent
Goo et al.

(10) Patent No.: US 7,259,065 B2
(45) Date of Patent: Aug. 21, 2007

(54) METHOD OF FORMING TRENCH IN SEMICONDUCTOR DEVICE

(75) Inventors: Doo-hoon Goo, Hwaseong-si (KR);
Si-hyeung Lee, Hwaseong-si (KR);
Han-ku Cho, Seongnam-si (KR);
Sang-gyun Woo, Yongin-si (KR);
Gi-sung Yeo, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 225 days.

(21) Appl. No.: 11/080,891

(22) Filed: Mar. 16, 2005

(65) Prior Publication Data

US 2005/0266646 A1    Dec. 1, 2005

(30) Foreign Application Priority Data

May 31, 2004    (KR) ............... 10-2004-0039224

(51) Int. Cl.
*H01L 21/336* (2006.01)
(52) U.S. Cl. ............ 438/259; 438/270; 438/424; 257/E21.546; 257/E21.646
(58) Field of Classification Search ........ 438/149, 438/259, 270, 424; 257/E21.646, E21.546
See application file for complete search history.

(56) References Cited

U.S. PATENT DOCUMENTS 5,442,212 A * 8/1995 Eimori .................. 257/303

6,362,506 B1 * 3/2002 Miyai .................. 257/330

FOREIGN PATENT DOCUMENTS

| EP | 0949681 B1 | 10/1999 |
| KR | 1020010003628 A | 1/2001 |
| KR | 1020030092862 A | 6/2003 |

* cited by examiner

*Primary Examiner*—Michael Lebentritt
*Assistant Examiner*—Stanetta Isaac
(74) *Attorney, Agent, or Firm*—Volentine & Whitt, PLLC

(57) ABSTRACT

There are provided a method of forming a trench for a recessed channel of a transistor and a layout for the same. A layout for the recessed channel according to one aspect of the present invention is formed such that an open region is extended across at least one of a first active region in a lateral direction, and also across another second active region in parallel with the first active region in a diagonal direction, and the extension is cut not to reach an isolation region between two third active regions that are in parallel with the second active region in a diagonal direction, and have noses facing each other in a longitudinal direction, and the layout includes an alignment of a plurality of open regions, which are discontinuously aligned. An etch mask is formed using the layout, and a semiconductor substrate is etched using the etch mask, and a trench for a recessed channel is formed on the active region.

17 Claims, 7 Drawing Sheets

METHOD OF FORMING TRENCH IN SEMICONDUCTOR DEVICE

BACKGROUND OF THE INVENTION

1. Field of the Invention

The present invention generally relates to a method of manufacturing a semiconductor device. More particularly, the present invention generally relate to a method of forming a trench in a semiconductor device.

A claim of priority is made to Korean Patent Application No. 2004-39224, filed on May 31, 2004, the disclosure of which is incorporated by reference.

2. Description of the Related Art

With recent developments in semiconductor devices, the size of components in the semiconductor devices has dramatically decreased. In addition, the integration of the semiconductor devices has rapidly increased. A reduction in chip size is regarded as an important factor in the development of highly-integrated semiconductor memory devices.

Many efforts have been made to reduce the chip size for a dynamic random access memory (DRAM) device. As a result of these efforts, a cell structure has changed to a planar alignment or a layout of active regions. A conventional layout for active regions is an $8F^2$ type structure. By changing an alignment of the active regions in such a structure, research is being done to further reduce a unit cell size while still using a minimum line width F in the $8F^2$ type structure.

As the integration of the semiconductor devices increases, coupled with the reduction in design rule, it has become more difficult to guarantee stable transistor operation. Further, as a width of a gate is reduced, short channel problems increases.

The short channel also produces punch-through between source and drain regions of the transistor. The punch-through is the main cause of transistor malfunctions. Therefore, many methods have been used to ensure a minimum channel length in order to overcome short channel problems. Specifically, attempts have been made to increase the channel length by recessing a semiconductor substrate under a gate in order to expand the channel length relative to a gate line width. There are many conventional methods of forming a MOS transistor having a recessed channel.

SUMMARY OF THE INVENTION

The present invention provides a method of effectively forming a trench for a recessed channel of a transistor with improved process margin, thereby improving the operation characteristics of a semiconductor device and increasing the integration of the semiconductor device.

The present invention discloses a method of manufacturing a semiconductor device by defining a plurality of active regions in a substrate each extending lengthwise along a first diagonal direction, the plurality of active regions being arranged in parallel with each other and separated by at least one isolation region, providing an etching mask pattern disposed on the substrate and defining a plurality of open regions, wherein the plurality of open regions each extend lengthwise along a second vertical direction at an angle with respect to the first diagonal direction, and at least one open region extends across at least one active region and over a portion at least one of the plurality of isolation regions, and forming a trench in the active region where the open region extends across the active region.

The present invention also discloses a method of manufacturing a semiconductor device by defining a plurality of active regions in a substrate each extending lengthwise along a first horizontal direction, the plurality of active regions being arranged in parallel with each other and separated by at least one isolation region, providing an etching mask-pattern disposed on the substrate and defining a plurality of open regions, wherein the plurality of open regions each extend lengthwise along a second vertical direction at an angle with respect to the first horizontal direction, and the active region extends across two parallel open regions and over a portion at least one of the plurality of isolation regions, and forming a trench in the active region where the open region extends across the active region.

BRIEF DESCRIPTION OF THE DRAWINGS

Aspects of the present invention will become more apparent with the description of the exemplary embodiments of the present invention with reference to the attached drawings in which.

DETAILED DESCRIPTION OF THE INVENTION

Figure 1:
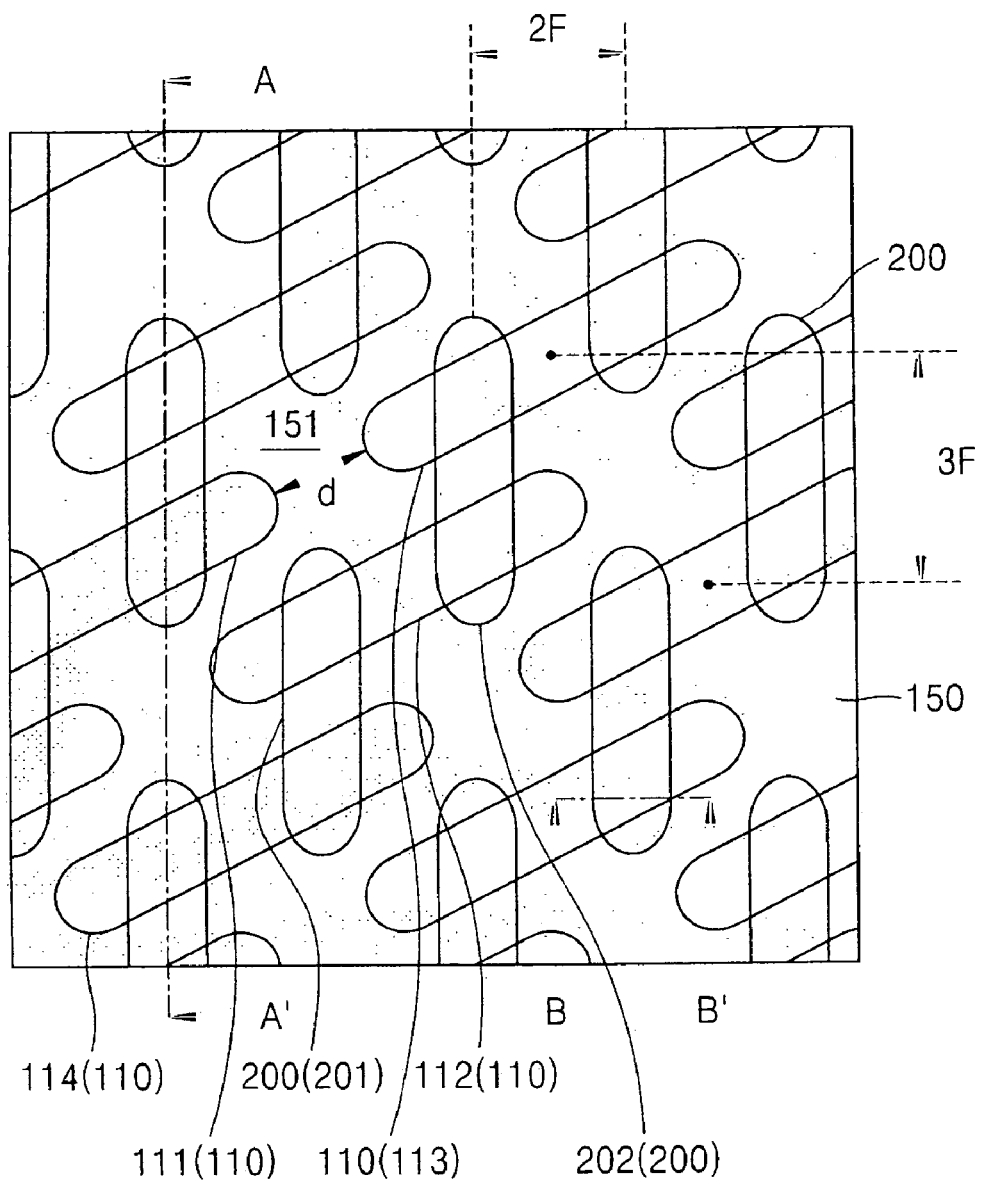
FIG. 1 is a schematic view illustrating a layout of a trench for a recessed channel according to a first embodiment of the present invention.
Figure 1:
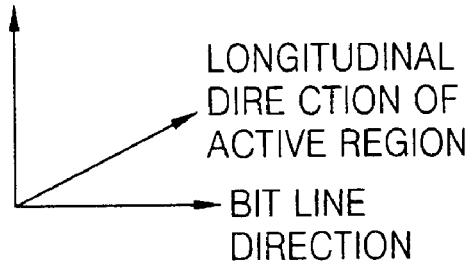

The present invention will now be described more fully hereinafter with reference to the accompanying drawings, in which preferred embodiments of the present invention are shown. The present invention may, however, be embodied in many different ways and should not be construed as being limited to the embodiments set forth herein. Rather, these embodiments are provided as working examples. In the drawings, the thicknesses of layers and regions are exaggerated for clarity. Like numbers refer to like elements throughout the specification. It will be understood that when an element such as a layer, a region or a substrate is referred to as being "on" or "onto" another element, it can be directly on the other element or intervening elements may also be present.

Methods of forming a transistor having a recessed channel by forming a trench across an active region on a semiconductor substrate are disclosed. A photo lithography process is preferably used to form the trench on the semiconductor substrate.

A trench does not extend into an isolation region, which is composed of an insulating material such as silicon oxide. However, an etch mask used in a photo lithography process may have a trench layout with a continuous line pattern that reaches an isolation region, or extends across the isolation region between the active regions.

Even if the trench layout is formed with a continuous line pattern, the etch rates for the silicon of the active region and the silicon oxide of the isolation region are different, therefore, the silicon is selectively etched. However, the trench is formed only in the active region. Still, there are undesirable problems if the trench layout is formed with a continuous line pattern. For example, extension of the active region in a relative diagonal direction is limited. As a result, when a capacitor is electrically connected to a transistor, the portion to which the capacitor is connected, that is, a buried contact (BC) area is limited. Sufficient BC area is critical to achieve reliable electrical interconnection in a memory device.

Extending the active region as far as possible in a relative diagonal direction by minimizing the distance between ends of active regions is very important in order to achieve sufficient BC area. However, in the trench layout with a continuous line pattern, the extension of the active region in the diagonal direction is limited in a line-type trench layout.

Conventionally, a line pattern of the trench layout intersecting a first active region does not intersect a second active region. In other words, one active region is aligned in a diagonal direction relative to another active region disposed adjacent thereto. The alignment of the active regions just described is referred to as a diagonal type alignment.

An active region is formed in a bar shape. For example, a bar shape where its longitudinal length is greater than its width, or a bar shape having a bulging middle portion. These active regions are aligned in the diagonal direction and parallel with each other, and aligned in such a manner that their respective ends face each other. Two active regions adjacent to each other are formed to be in parallel along their entire length, or partially parallel along their length to maximize areas of the active regions.

Any two parallel active regions nearest each other, i.e., aligned in a diagonal direction relative to each other, may not share a common word line. Thus, in a linear layout for a trench located on substantially the same position as the word line, the linear layout for the trench passes through any one active region, and does not enter another active region positioned in a diagonal direction relative to the active region. Therefore, any one active region positioned in a diagonal direction may not extend beyond a linear line pattern for the trench. Therefore, since a width of the active region in a diagonal direction is limited, it is difficult to expand a connection area in the interconnecting structure.

In order to overcome this limitation, an embodiment of the present invention provides a trench layout having aligned open regions. Each open region is preferably formed to extend across one or two adjacent active regions. For example, the open region may be shaped similar to a hole pattern for a contact.

The trench layout to form a recessed channel according to an embodiment of the present invention employees a $8F^2$ alignment or the modified $8.xxF^2$ alignment, and a $6F^2$ alignment or a modified $6.xxF^2$ alignment. The $6F^2$ alignment and the $6.xxF^2$ alignment can obtain a higher integration than the $8F^2$ alignment or the $8.xxF^2$ alignment. The $6.6F^2$ alignment is an example of the $6.xxF^2$ alignment, i.e., a 2Fx3.3F alignment. The alignment of the active regions is preferably diagonal.

FIRST EMBODIMENNT

Figure 5:
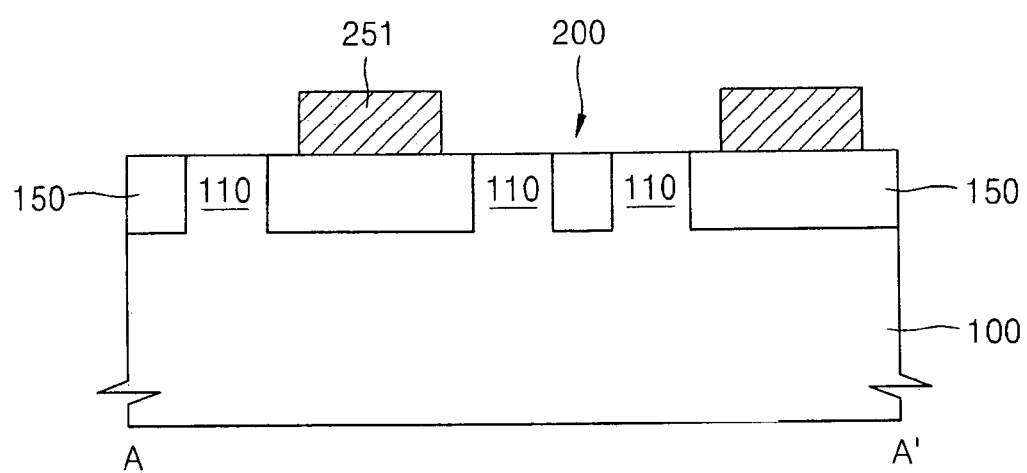

Open regions 200, 201, 202 in the trench layout of FIG. 1 presents regions which are exposed by an etch mask during an etching process. In FIG. 1, reference numerals 200, 201, and 202 all represent an open region, however, different reference numerals are used to identify a specific open region for explanation purposes. Reference number 200 is used to genetically represent the open regions. Referring to FIGS. 1 and 5, open region 200 is exposed by an etch mask pattern.

Open region 200 has a rectangular shape pattern or a bar shape pattern across an active region 110. Reference numerals 110, 111, 112, 113, and 114 all represent the active region, however, different reference numerals are used to identify a specific active region for explanation purposes. Reference number 110 is used to genetically represent the active regions. Active region 110 is formed in an isolation region 150 having an insulating layer. The insulating layer is preferably silicon oxide ($SiO_2$). Active region 110 is configured in a long rectangular shape or a bar shape in the diagonal direction. Active region 110 can be modified to have a bulging middle portion (see FIG. 9), but the overall shape maintains a long bar figure.

Relative to active region 110, open region 200 is aligned to extend along the direction sloping at a predetermined angle with respect to the longitudinal direction of active region 110. Preferably, open regions 200 do not contact each other as shown in FIG. 1.

Figure 6:
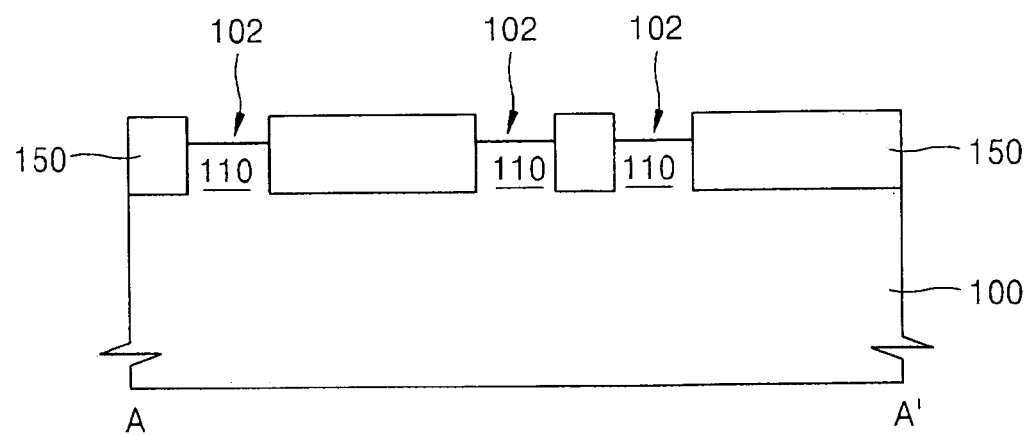

Opening region 200 is aligned substantially along a word line of a memory device, which comprises memory cells disposed at intersecting positions of the word lines and bit lines (not shown). Since open region 200 is provided to form a trench 102 on active region 110 as shown in FIG. 6, an isolation region 150 does not extend into active region 110.

However, it is easier to transfer open regions 200 on semiconductor substrate 100 during a photolithography process if the width or length of open region 200 are larger. Therefore, open region 200 extends into isolation region 150 across active region 110.

However, open region 200 does not extend into an isolation region 151, i.e., an area between ends of two active regions 111, 113. If open region 200 extends into isolation region 151, it is difficult for active region 110 to further extend in the diagonal direction of active region 200 to increase its lengths.

Therefore, a distance "d" between the ends of two active regions 111, 113 can be further reduced without active region 110 contacting open region 200. As a result, active regions 110 can be further extended to ensure more area for the electrical connecting portion, i.e., BC areas.

Open region 200 is designed to extend across only one active region 110 at the lateral side of the active region depending on how active regions 110 are aligned on a semiconductor substrate 100, or across two active regions 110 disposed in parallel with each other as shown in FIG. 1.

For example, FIG. 1 shows an open region 202 aligned and extending across two active regions 112, 113, which are aligned in parallel with each other in the diagonal direction. Here, the position relation of active region 110 can be understood such that another active region 112 is disposed relative to active region 110 in a diagonal direction of active region 110. In such an alignment or displacement of the diagonal direction, isolation region 151, which is an area between the ends of two active regions 111, 113, is located on one lateral side of the active region 110.

Further, the diagonal direction of active regions 110 of FIG. 1 substantially coincides with a diagonal direction between a bit line direction and a word line direction. Since an interval between one bit line and another bit line is substantially three times a minimum line width F, i.e., 3F, and an interval between one word line and another word line is substantially 2F, the alignment of active region 110 of FIG. 1 is substantially $6F^2$. Therefore, the alignment of active region 110 according to a first embodiment of the present invention is a $6F^2$ alignment, or a modified $6.xxF^2$ alignment.

In the diagonal type $6F^2$ alignment, open region 202 extends across two active regions 112, 113, which are in parallel with each other. Two open regions 201, 202 may cross a single active region 112. For example, first opening region 201 intersects first active region 112 at one end and intersects a second active region 114, which is below and parallel with first active region 112; a second opening region 202 intersects first active region 112 on the other end and intersects a third active region 113, which is above and parallel with first active region 112.

As such, the reason that the second open region 202 is extended in the opposite direction to first open region 201 is to obtain the same relations around second open region 202 or environment conditions identical to those of first open region 201. By doing so, the basic pattern is repeated, and many advantages can be provided during the process of forming a photo mask for open regions 200 or an etch mask pattern. For example, the repetition of the pattern may alleviate resolution limitations during a photolithography process.

When active region 110 is aligned in the $6F^2$ alignment or the modified $6.xxF^2$ alignment, relative to any one of open regions 200, open region 200 is designed to extend across two active regions, which are adjacent and in parallel with each other.

Figure 2:
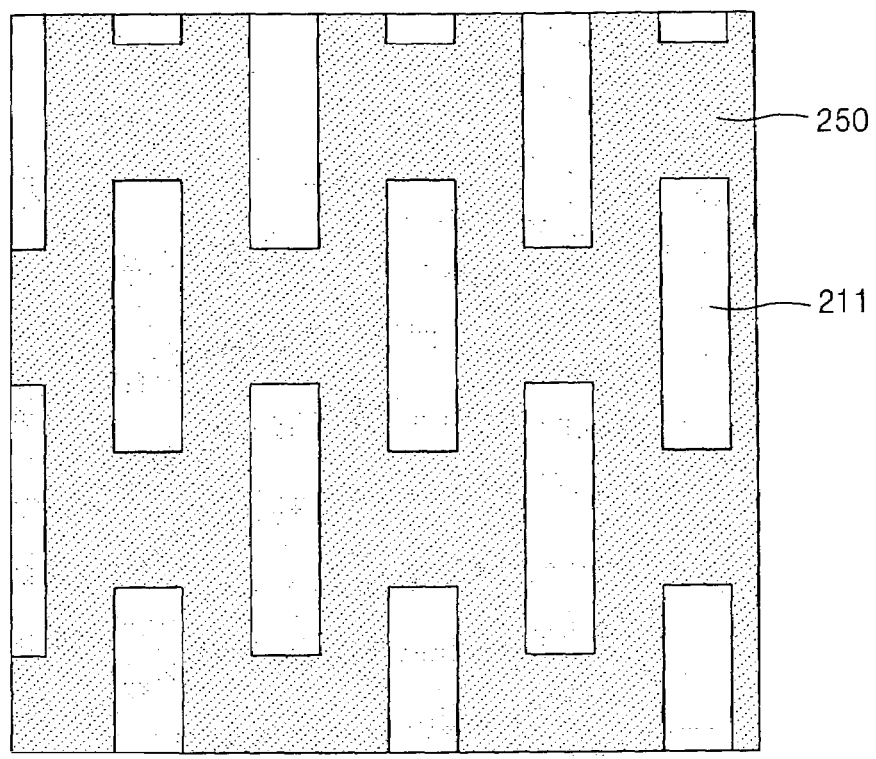
FIGS. 2 and 3 are schematic views illustrating layouts of photo masks for providing the layout according to the first embodiment of the present invention.
Figure 3:
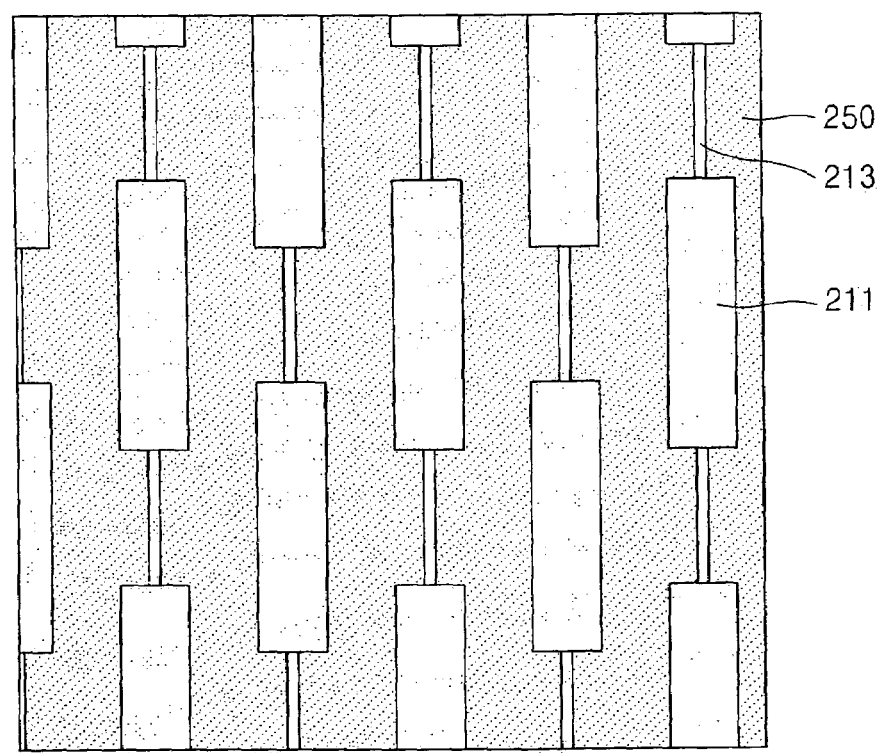

The alignment of open regions 200 in the trench layout is obtained on a semiconductor substrate based on the layout on a photo mask as shown in FIGS. 2 and 3. Referring to FIG. 2, the alignment of open regions 200 in FIG. 1 is transferred on a semiconductor substrate by a photo mask having a shading region 250 and a transmission region 211, which correspond to open regions 200.

Transmission region 211 is preferably formed as individual islands, which are separated by shading region 250. Alternatively, as shown in FIG. 3, an assist feature 213 is interposed between two transmission regions 211.

Assist feature 213 has a hole or a bar shape, and has a smaller size or width than that of transmission region 211. Assist feature 213 provides to connect the transmission regions 211 as shown in FIG. 3, or provided between the transmission regions 211 or around and spaced apart from them. Assist features 213 assist in the precise transfer of patterns onto the semiconductor substrate during an exposure process. In particular, transferring the precise shape of open regions 200.

As such, the trench is formed on the semiconductor substrate as shown in FIGS. 4 through 8.

Figure 4:
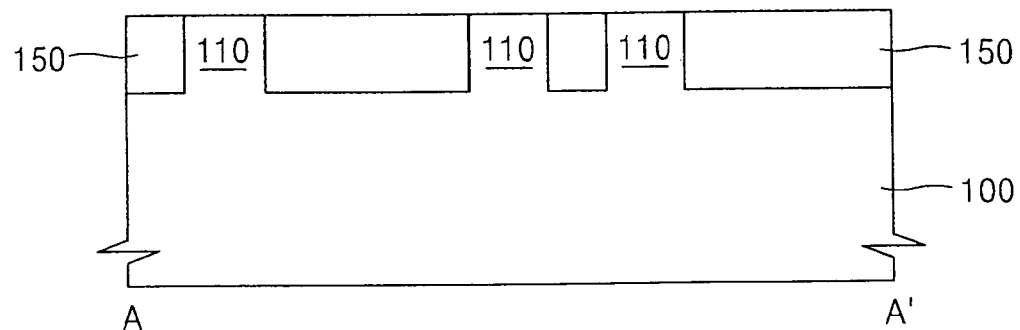
FIGS. 4 through 7 are schematic sectional views illustrating a method for forming the trench according to the first embodiment of the present invention, taken along line A-A' of FIG. 1.

Referring to FIG. 4, in a method to form the trench of the first embodiment of the present invention, an isolation region 150 defining active regions 110 in a $6F^2$ alignment is provided on a semiconductor substrate 100. Isolation region 150 is formed by an isolation method such as a shallow trench isolation (STI) process.

Referring to FIG. 5, a photolithography process is performed using a photomask having a layout similar to FIG. 2 or FIG. 3, to form an etch mask pattern 251, which defines open regions 200. Etch mask pattern 251 opens an exposure region as shown in FIG. 1. Etch mask pattern 251 is preferably a photoresist pattern.

Referring to FIG. 6, using etch mask pattern 251 as an etch mask, a selective etching process is performed on the exposed region. The etching process is performed by an anisotropic dry etching process, and the etching is selectively performed relative to silicon of active region 110. Therefore, isolation region 150 is not etched during this etching process. Therefore, only selective portions of active region 110 exposed inside open region 200 are etched and removed to form a trench 102 intersecting active region 110. Trench 102 is disposed on a word line or a gate line of the memory device.

Figure 7:
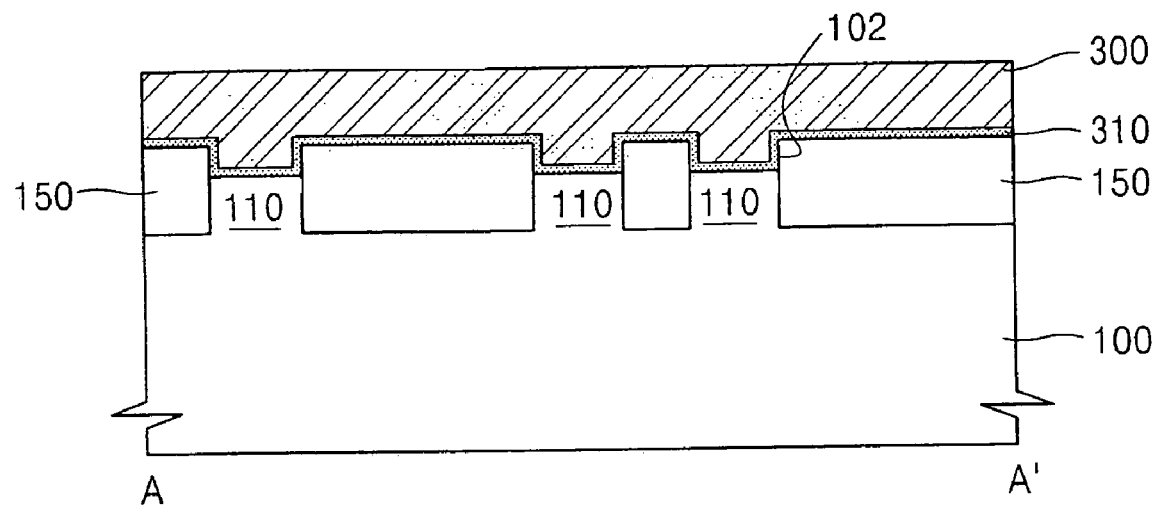
Figure 8:
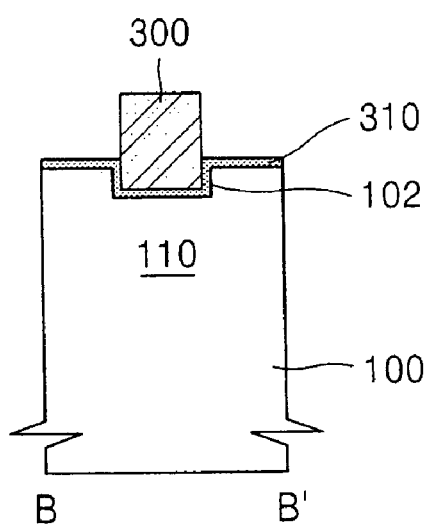
FIG. 8 is a schematic sectional view illustrating a method for forming the trench according to the first embodiment of the present invention, taken along line B-B' of FIG. 1.

Then, as shown in FIGS. 7 and 8, a gate oxide layer 310 is formed on the resultant structure. A conductive layer, for example, a conductive polysilicon layer or a tungsten silicide ($WSi_x$) layer is formed on gate oxide layer 310, and patterned to form a gate line 300. As shown in FIG. 8, the channel formed under gate line 300 passes under trench 102, and the channel is formed longer than a width of gate line 300.

Although a trench layout for a recessed channel for a transistor having a $6F^2$ alignment for active regions have been disclosed, the present invention can also be employed on a $8F^2$ alignment and a modified $8.xxF^2$ alignment for active regions.

THE SECOND EMBODIMENT

Figure 9:
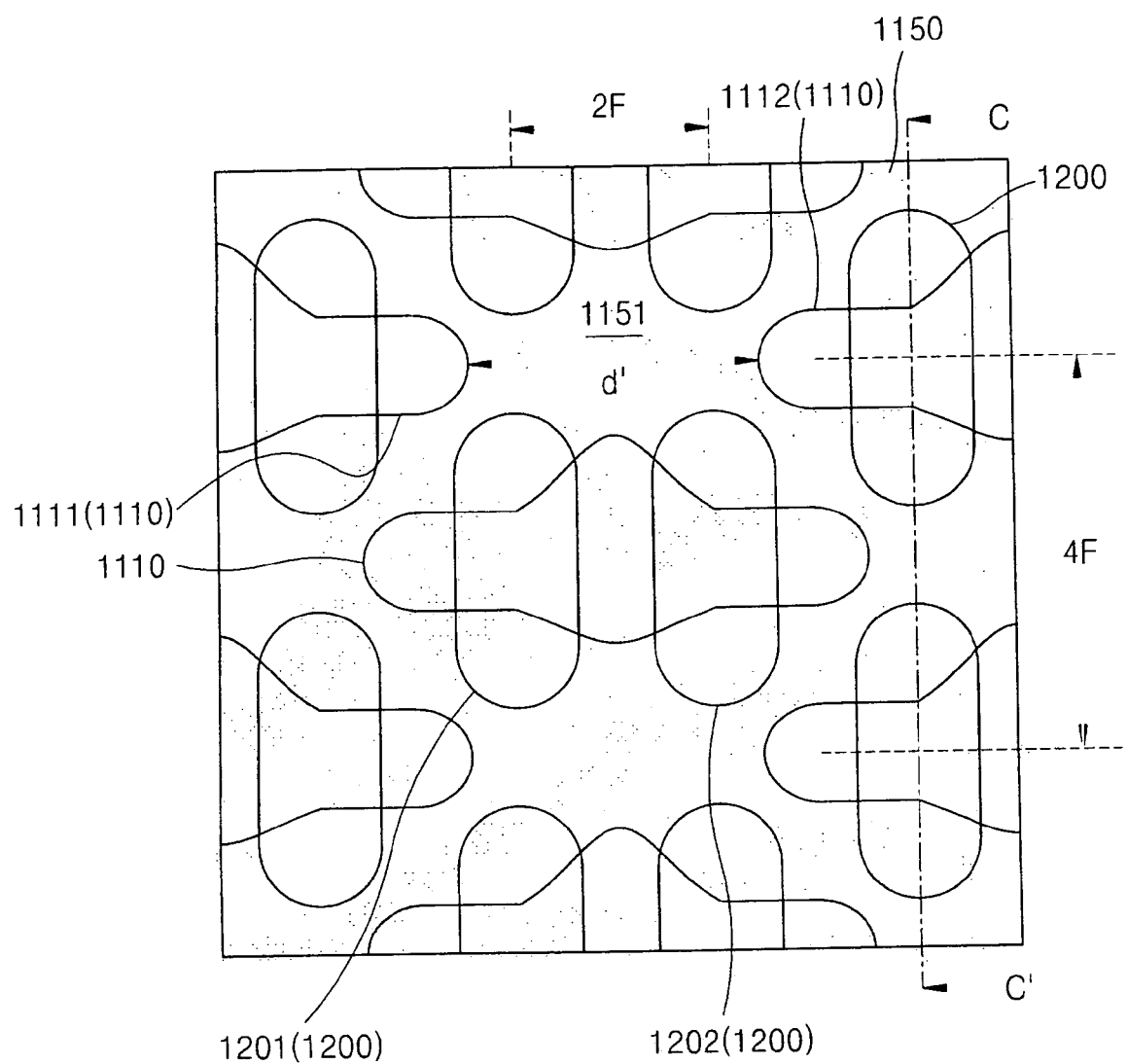
FIG. 9 is a schematic sectional view illustrating the layout of the trench according to a second embodiment of the present invention.

A trench layout according to a second embodiment of the present invention is shown in FIG. 9. An open region 1200 has a region exposed by an etch mask pattern during an etching process to form a trench similar to the first embodiment. That is, open region 1200 has a region exposed by an etch mask pattern 1251 formed on a semiconductor substrate 1100.

Open region 1200 is designed to have a rectangular or bar shape pattern across an active region 1110, similar to the first embodiment. Active region 1110 is provided in an isolation region 1150. As shown in FIG. 9, active region 1110 is modified to have a bulging middle portion, in order to ensure sufficient area for a direct contact (DC), which is connected with a bit line in an interconnection structure.

Open region 1200 is set or designed to be extended in the lateral direction of long-shaped active region 1110, that is, in the direction perpendicular to the longitudinal direction of active region 1110. A plurality of the open regions 1200 are aligned such that their ends face each other as shown in FIG. 9. Further, open regions 1200 are aligned but separated from each other, like a pattern layout for contact holes.

Figure 11:
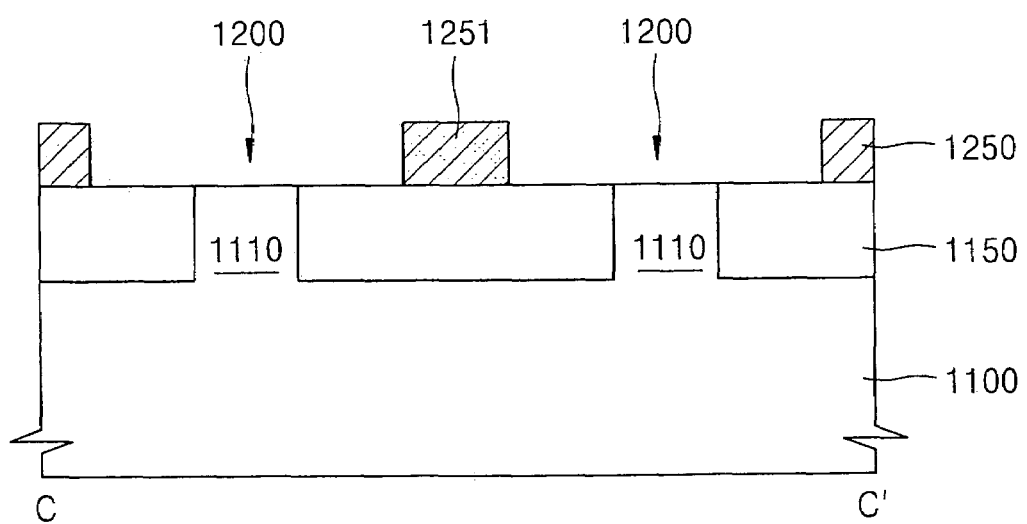
FIGS. 11 through 13 are schematic sectional views illustrating a method for forming the trench according to the second embodiment of the present invention, taken along line C-C' of FIG. 9.

Open regions 1200 are aligned along the word line of a memory device. Open region 1200 is provided to form a trench 1102 in active region 1110 as shown in FIG. 11, and which does not necessarily extend to an isolation region 1150 beyond active region 1110.

It open region 1200 is designed with a larger width or length, it is advantageous in a photolithography process.

Open region 1200 is extended as far as possible to isolation region 1150, but does not reach an isolation region 1151 between two active regions 1111 and 1112. The reason is that a distance "d" between the ends of two active regions 1111, 1112, for example, can be further reduced without two active regions 1111, 1112 reaching open region 1200. Thus, a connection area in the BC sites can be provided.

Since the alignment of active regions 1110 shown in FIG. 9 is designed such that the longitudinal direction of active regions 1110 substantially corresponds to the direction of a bit line, and an interval between two bit lines is four times a minimum line width F, that is, 4F, and an interval between two word lines is 2F; therefore, the alignment is $8F^2$ alignment and a modified $8.xxF^2$ alignment.

Open region 1200 in the $8F^2$ alignment is designed to correspond to only one active region 1110, and extends to isolation region 1150 to define active region 1110, and not to reach other adjacent active regions 1110. Further, open region 1200 is designed in parallel with another open region 1200 on one active region 1110, while spaced from each other. Two open regions 1200 respectively intersecting the one active region 1110 are substantially a mirror image of each other. This pattern creates advantages during the process of using a photomask for open regions 1200 or an etch mask pattern thereof. For example, the repetition of the pattern may alleviate limits of a resolution in the photolithography process.

As a result, when active regions 1110 are aligned in the $8F^2$ alignment, or the modified $8.xxF^2$ alignment, open region 1200 is designed across each of active regions 1110.

Figure 10:
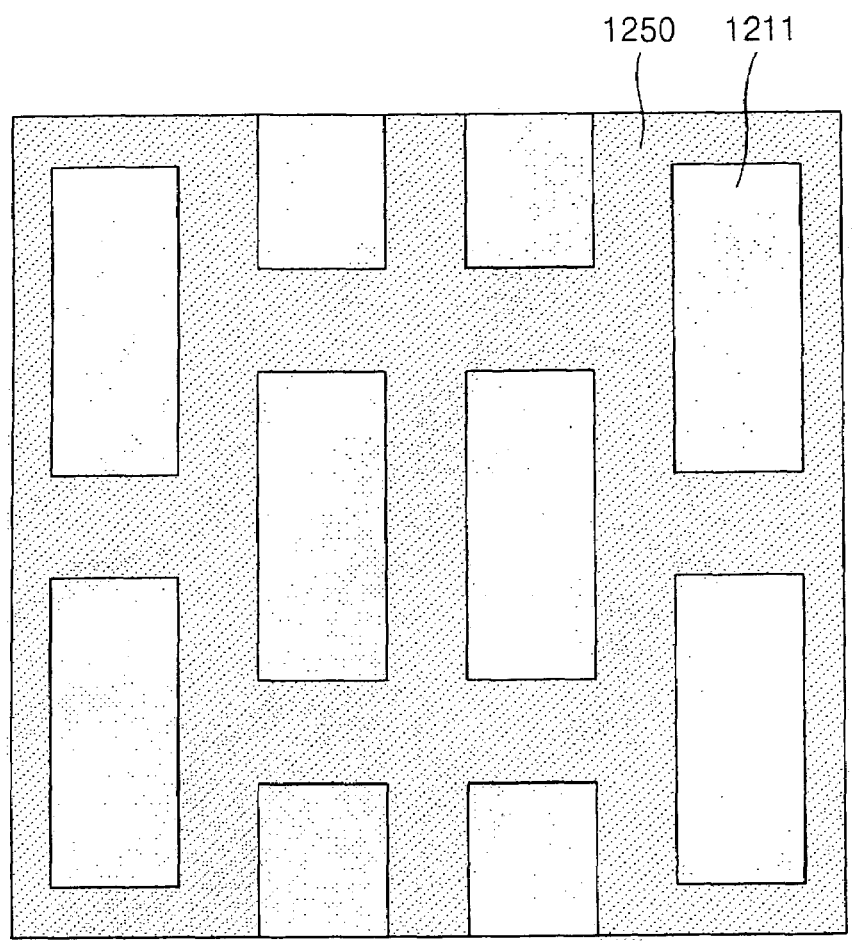
FIG. 10 is a schematic view illustrating a layout of a photo mask for providing a layout for the trench according to the second embodiment of the present invention.

An alignment of open regions 1200 is realized on a semiconductor substrate by the layout of a photo mask as shown in FIG. 10. Referring to FIG. 10, an alignment of open regions 1200 is transferred on a semiconductor substrate through an exposure process by a photomask having a shading region 1250 defining a transmission region 1211 corresponding to open region 1200.

As shown in FIG. 10, transmission region 1211 is formed of individual islands, which is separated by shading region 1250. Alternatively, an assist feature (not shown) can be interposed between two transmission regions 1211, see FIG. 3.

Referring to FIG. 11, in a method to form a trench for a recessed channel according to a second embodiment of the present invention, an isolation region 1150 is formed to define active regions 1110 in a $8F^2$ alignment on a semiconductor substrate 1100.

Then, a photolithography process is performed using a photomask having a layout similar to FIG. 10. An etch mask pattern 1251 exposes a region which defines open region 1200. Etch mask pattern 1251 is preferably a photoresist pattern.

Figure 12:
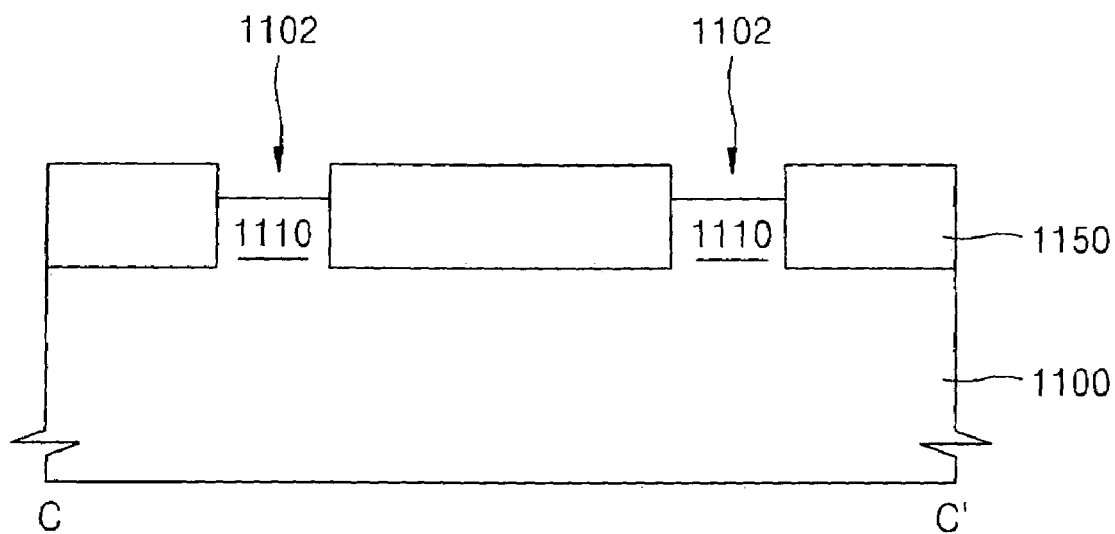

Referring to FIG. 12, a selective etching process is performed on the region corresponding to the exposure region, that is, open region 1200, using etch mask pattern 1251 as an etch mask. The etching process may be an anisotropic dry etching process, so that only active region 1110 exposed in open region 1200 is selectively etched and removed to form a trench 1102 intersecting active region 1110. Trench 1102 is located on a word line or a gate line of a memory device.

Figure 13:
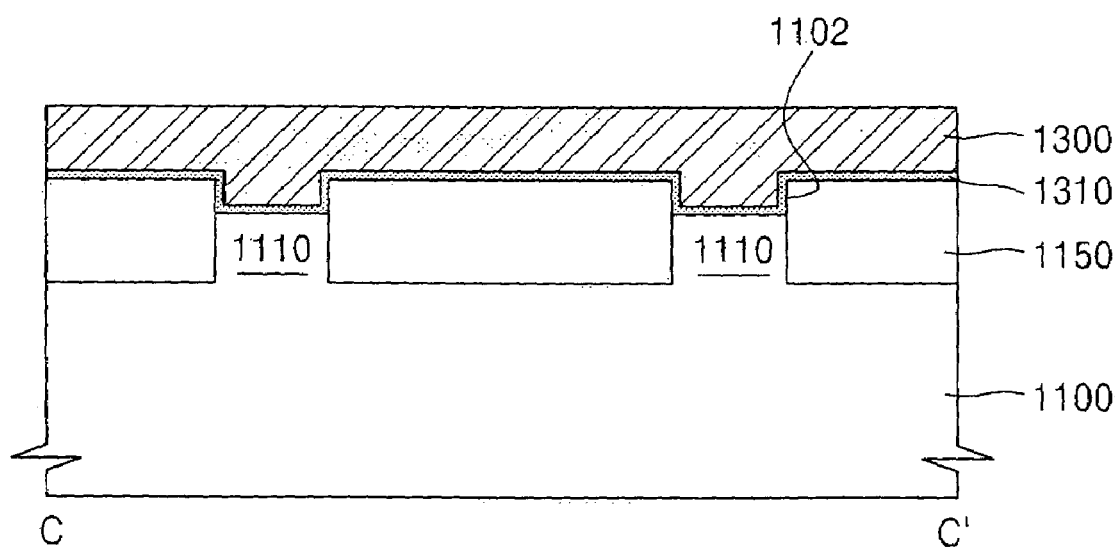

Then, a gate oxide layer 1310 is formed as shown in FIG. 13. A conductive layer, for example, a conductive polysilicon layer or a tungsten silicide ($WSi_x$) layer, is formed on gate oxide layer 1310, and patterned to form a gate line 1300. Since a channel formed under gate line 1300 passes under trench 1102, the channel is formed with an extended length longer than a width of gate line 1300.

As described above, according to the present invention, the layout to form a recessed channel trench can be employed to form a trench across an active region in accordance with a $6F^2$ alignment and a modified $6.xxF^2$ alignment, which provides a high integration. Since the layout for a trench is formed such that the open region is not extended to the isolation region between two active regions having their ends facing each other, and the open regions are aligned discontinuously, the two active regions can be further extended along the longitudinal direction while being closer to each other. Thus, it becomes easier to ensure an area for BC connection sites in the active region or a connection margin.

While the present invention has been particularly shown and described with reference to exemplary-embodiments thereof, it will be understood by those of ordinary skill in the art that various changes in form and details may be made therein without departing from the scope of the present invention.

What is claimed is:

1. A method of manufacturing a semiconductor device, comprising:

forming an isolation region in a substrate having a defined upper surface, such that the isolation region has an upper surface co-planar with the defined upper surface;

defining a plurality of active regions in the substrate, each active region having an upper surface co-planar with the defined upper surface and extending lengthwise along a first diagonal direction, the plurality of active regions being arranged in parallel and separated one from another within the isolation region;

providing an etching mask pattern disposed on the defined upper surface of the substrate to define a plurality of open regions that expose at least a portion of each one of the plurality of active regions and at least a portion of the isolation region, wherein each one of the plurality of open regions extends lengthwise along a second vertical direction at an angle with respect to the first diagonal direction, and at least one open region extends across at least one active region and over a portion of the isolation region; and etching the portion of each one of the plurality of active regions exposed through the plurality of open regions to form respective trenches having an upper surface below the defined upper surface of the substrate.

2. The method of claim 1, further comprising;

forming a gate oxide layer on the isolation region, the plurality of active regions, and the respective trenches;

forming a conductive layer on the gate oxide layer; and patterning the conductive layer to form a gate line, at least a portion of which is disposed in the trench.

3. The method of claim 1, wherein the etching mask pattern is provided by a photolithography process using a photomask having a plurality of transmission regions, which correspond to the plurality of open regions.

4. The method of claim 3, wherein the plurality of transmission regions are connected by an assist feature.

5. The method of claim 1, wherein the plurality of active regions are aligned in a $6F^2$ alignment or a $6.xxF^2$ alignment.

6. The method of claim 1, wherein the plurality of active regions are aligned in a $8F^2$ alignment or a $8.xxF^2$ alignment.

7. The method of claim 1, wherein the open region extends across two active regions.

8. The method of claim 1, wherein the isolation region is formed from one or more Shallow Trench Isolation (STI) regions formed in the substrate.

9. A method of manufacturing a semiconductor device, comprising:

forming an isolation region in a substrate having a defined upper surface, such that the isolation region has an upper surface co-planar with the defined upper surface;

defining a plurality of active regions in the substrate, each active region having an upper surface co-planar with the defined upper surface and extending lengthwise along a first horizontal direction, the plurality of active regions being arranged in parallel and separated one from another within the isolation region;

providing an etching mask pattern disposed on the defined upper surface of the substrate to define a plurality of open regions that expose at least a portion of each one of the plurality of active regions and at least a portion of the isolation region, wherein each one of the plurality of open regions extends lengthwise along a second vertical direction perpendicular to the first horizontal direction, wherein each active region extends across two adjacent open regions and over at least a portion of the isolation region; and etching the portion of each one of the plurality of active regions exposed through the plurality of open regions to form respective trenches having an upper surface below the defined upper surface of the substrate.

10. The method of claim 9, further comprising;

forming a gate oxide layer on the isolation region, the plurality of active regions, and the respective trenches;

forming a conductive layer on the gate oxide layer; and patterning the conductive layer to form a gate line, at least a portion of which is disposed in the trench.

11. The method of claim 9, wherein the etching mask pattern is provided by a photolithography process using a photomask having a plurality of transmission regions, which correspond to the plurality of open regions.

12. The method of claim 11, wherein the plurality of transmission regions are connected by an assist feature.

13. The method of claim 12, wherein the plurality of active regions are aligned in a $8F^2$ alignment or a $8.xxF^2$ alignment.

14. The method of claim 9, wherein the active region has a bulge at about its center.

15. The method of claim 9, wherein each one of the plurality of active regions has a geometry defined by lateral ends of substantially the same width separated by a bulging center portion having a width greater than the lateral ends.

16. The method of claim 15, wherein each one of the active regions is defined as to be symmetrically centered in relation to two adjacent open regions.

17. The method of claim 9, wherein the isolation region is formed from one or more Shallow Trench Isolation (STI) regions formed in the substrate.

* * * * *